United States Patent [19]

Hofer et al.

[11] Patent Number: 4,504,526

[45] Date of Patent: Mar. 12, 1985

[54] APPARATUS AND METHOD FOR PRODUCING A LAMINAR FLOW OF CONSTANT VELOCITY FLUID ALONG A SUBSTRATE

[75] Inventors: Peter H. Hofer, Perrysburg; Eberhard R. Albach, Toledo, both of Ohio

[73] Assignee: Libbey-Owens-Ford Company, Toledo, Ohio

[21] Appl. No.: 535,798

[22] Filed: Sep. 26, 1983

[51] Int. Cl.$^3$ .................... C23C 11/00; C23C 13/00
[52] U.S. Cl. ............................. 427/248.1; 427/255; 118/718; 118/719
[58] Field of Search .............. 118/718, 719; 427/255, 427/248.1

[56] References Cited

U.S. PATENT DOCUMENTS 3,790,404  2/1974  Garnache et al. ............ 118/719 X
3,805,736  4/1974  Foehring et al. ................ 118/719

Primary Examiner—Michael R. Lusignan
Attorney, Agent, or Firm—Phillip S. Oberlin

[57] ABSTRACT

The present invention relates to an apparatus and method for directing a constant velocity laminar flow of a fluid along a surface of a planar substrate. The apparatus comprises a plurality of serially arranged, individual passageways interconnecting an inlet and an outlet. The inlet is adapted to be connected to a supply of fluid, while the outlet is positioned adjacent the surface of the substrate for directing the uniform laminar flow of fluid onto the substrate surface. The individual passageways are adapted to vary the velocity of the fluid as it passes through the passageways to ensure that a laminar flow of constant velocity is produced along the surface of the substrate. In the preferred embodiment of the invention, the apparatus is utilized to apply a metal oxide coating to a sheet of moving glass. In these instances, the outlet is an elongate nozzle extending transversely relative to the path of the moving glass to enable a gaseous reactant utilized to form the metal oxide coating to be applied across the entire width of the glass sheet. In one embodiment of the invention, the individual passageways are alternating converging and diverging passageways which function to evenly distribute the fluid within the passageways such that the fluid exits the elongate outlet at a relatively constant velocity to produce a uniform laminar flow of the gaseous reactant across the glass sheet.

27 Claims, 5 Drawing Figures

APPARATUS AND METHOD FOR PRODUCING A LAMINAR FLOW OF CONSTANT VELOCITY FLUID ALONG A SUBSTRATE

BACKGROUND OF THE INVENTION

The present invention relates generally to an apparatus and method for directing a laminar flow of a fluid along the surface of a planar substrate. In particular, the apparatus of the present invention is utilized to coat a substrate by means of a chemical vapor deposition process by directing a laminar flow of a gaseous reactant mixture toward the surface of the substrate to cause the reactant mixture to deposit the desired coating on the substrate surface.

Chemical deposition processes such as pyrolytic processes and hydrolytic processes are well known in the art of coating substrates. The physical form of the coating reactants employed in such processes may be liquid, vapor, liquids or solids dispersed in gas mixtures, aerosols, or vaporized or vaporous coating reactants dispersed in gas mixtures.

One of the problems associated with coating substrates by directing a gaseous reactant mixture along a substrate surface to deposit the coating relates to maintaining a uniform thickness of the coating along the substrate. In certain instances, such as the application of a reflective metal oxide coating to a sheet of glass, the requirement that the coating have a uniform thickness is especially important since small variations in the coating thickness can result in the glass sheet having poor optical quality. For example, variations in thickness of the metal oxide coating of one millionth of an inch can produce an undesirable optical effect or an unaesthetic appearance in the glass. Generally, in order to produce a coating having a constant thickness, it is necessary that the gaseous reactant mixture be uniformly applied to the entire sheet of glass.

SUMMARY OF THE INVENTION

The present invention relates to an apparatus and method for directing a laminar flow of constant velocity fluid toward the surface of a substrate. In the preferred embodiment, the apparatus is utilized to apply a metal oxide coating to a sheet of moving glass by directing a laminar flow of a gaseous reactant mixture onto the surface of the glass, thereby causing the reactant mixture to deposit the desired coating on the glass surface. The apparatus produces the laminar flow by supplying the gaseous reactant at a constant velocity throughout the length of an elongate outlet nozzle positioned transversely to the direction of travel of the glass sheet.

More specifically, the apparatus comprises a plurality of serially arranged, individual passageways interconnecting an inlet means and an outlet means. The inlet means is adapted to be connected to a supply of fluid, while the outlet means includes an opening positioned adjacent the surface of the substrate for directing the laminar flow of fluid onto the substrate surface. Each of the individual passageways includes a portion having a cross sectional area different from the cross sectional area of each of the adjacent ones of the passageways for causing the velocity of the fluid flowing through the passageways to vary. It has been found that causing the velocity of the fluid to change as it flows through the passageways enables the fluid to be uniformly distributed throughout the passageways such that the fluid is delivered from the opening of the outlet means at a predetermined constant velocity to produce a laminar flow on the substrate surface.

Several embodiments of the present invention have been proposed for producing the velocity changes in the fluid as the fluid flows through the individual passageways. In one embodiment, the individual passageways are formed as alternating converging and diverging passageways which function to alternately accelerate and decelerate the fluid as it passes through the passageways. In an alternate embodiment of the invention, the series of individual passageways alternate between a passageway having a uniform first predetermined cross sectional area and a passageway having a second uniform predetermined cross sectional area smaller than the first predetermined area, thereby alternately decreasing and increasing the velocity of the fluid as it flows through the passageways. In a further embodiment of the invention, the individual passageways comprise a series of passageways each having a uniform cross sectional area, wherein the area of each passageway is smaller than the area the preceding adjacent passageway. In this embodiment, the velocity of fluid is continually increased as it passes from one passageway to another passageway.

BRIEF DESCRIPTION OF THE DRAWINGS

The above, as well as other advantages of the present invention, will become readily apparent to one skilled in the art from reading the following detailed description in conjunction with the attached drawings, in which.

DESCRIPTION OF THE PREFERRED EMBODIMENT

Figure 1:
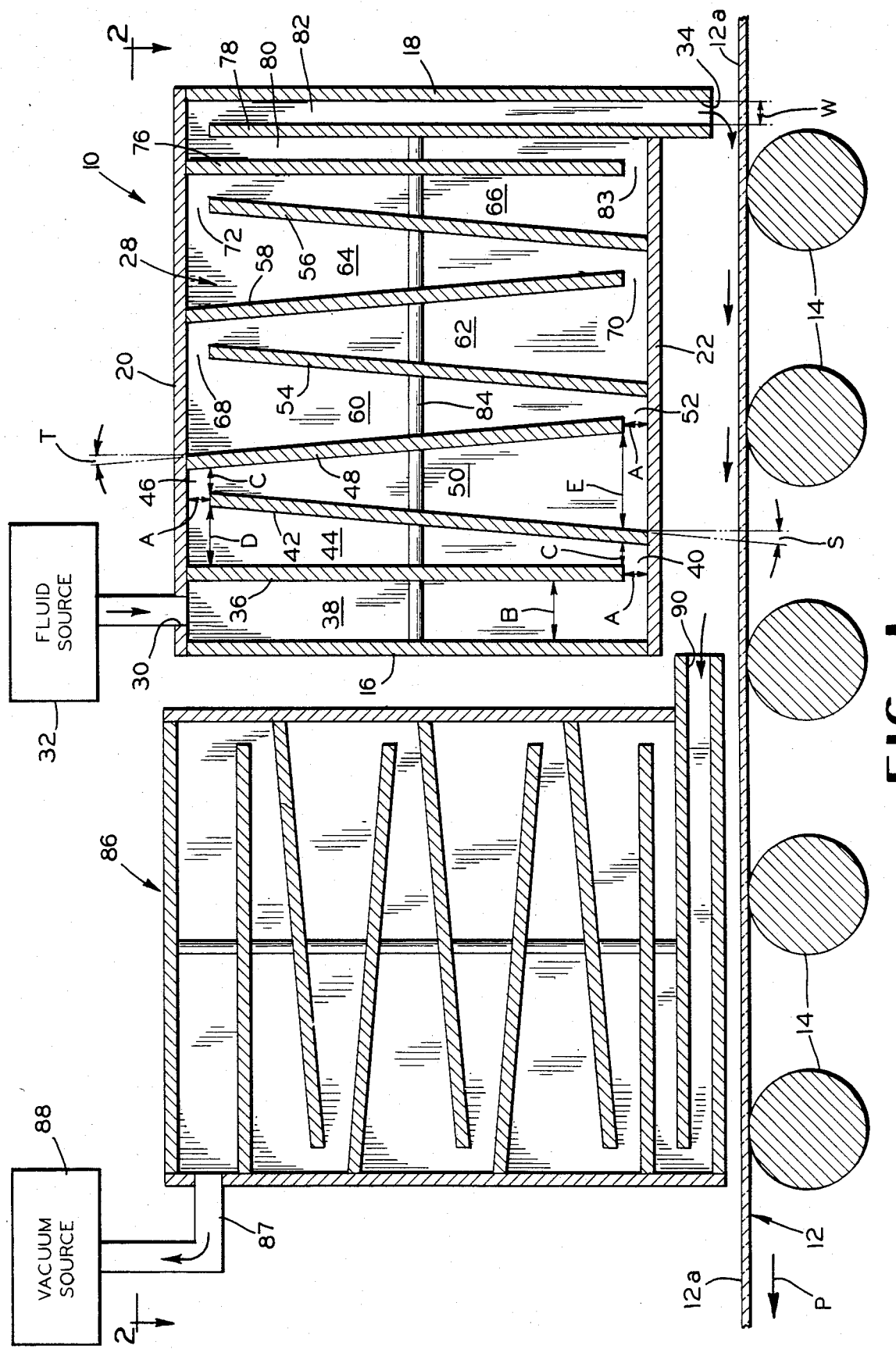
FIG. 1 is a cross-sectional schematic view illustrating one embodiment of the apparatus of the present invention utilized to apply and withdraw a laminar flow of constant velocity fluid along the surface of a substrate.

Referring to FIG. 1, there is shown a schematic diagram of an apparatus 10 adapted to direct a laminar flow of a fluid onto an upper surface 12a of a planar substrate 12. The substrate 12 is supported by rollers 14 and is conveyed along a generally linear path (as represented by direction arrow P) by suitable conveyor means (not shown). In the preferred embodiment of the invention, the apparatus 10 is utilized to apply a coating to the surface 12a by means of a chemical vapor deposition process. Thus, the fluid is typically a gaseous reactant mixture which reacts to deposit a coating on the surface 12a. For example, the substrate 12 can be a sheet of glass and the gaseous reactant mixture can react to form a reflective metal oxide coating on the surface 12a.

While it will be appreciated that the apparatus 10 can be formed in a variety of shapes, the preferred embodiment of the apparatus 10 is in the form of a generally rectangular, elongate box having spaced apart generally parallel sidewalls 16 and 18, an upper wall 20, a lower wall 22, and spaced apart end walls 24 and 26 (shown in FIG. 2), all of which cooperate to define a generally enclosed chamber 28.

The apparatus includes at least one inlet 30 centrally located along one longitudinal edge of the upper wall 20. The inlet 30 is connected to receive a supply of fluid from a fluid source 32. It will be appreciated that, in some instances, it may be desirable to provide a plurality of inlets for introducing the fluid into the apparatus 10. Also, it is not necessary that the inlet 30 be located along the edge of the upper wall 20. For example, the inlet can be located in the sidewall 16.

Figure 2:
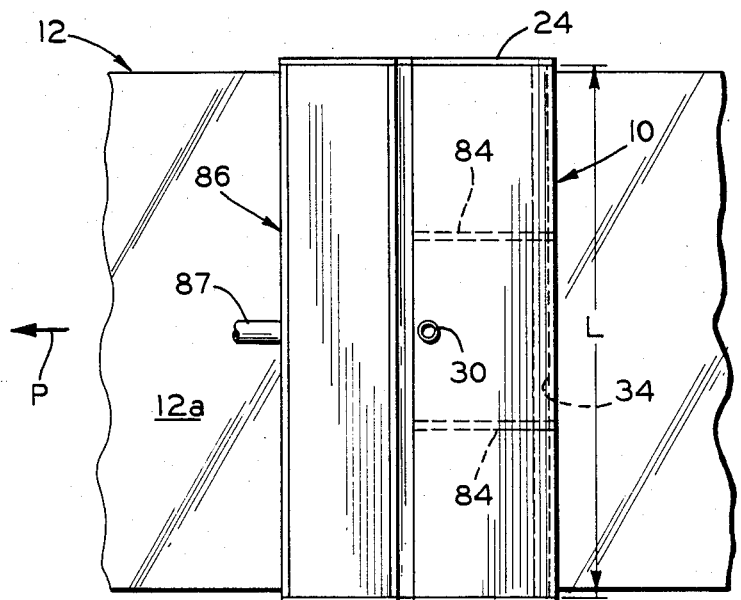
FIG. 2 is a top plan view of the apparatus shown in FIG. 1 taken along the line 2—2 of FIG. 1.

As will be discussed, the apparatus 10 is provided with a plurality of wall members mounted within the chamber 28 which cooperate to direct the fluid through a series of alternating converging and diverging passageways. The alternating converging and diverging passageways function to evenly distribute the fluid within the passageways throughout the entire longitudinal length of the passageways such that the fluid exits an elongate outlet nozzle 34 at a relatively constant velocity to produce a uniform laminar flow of the fluid along the surface 12a. The outlet nozzle 34 is in the form of an elongate slot having a predetermined width W (shown in FIG. 1) and extending a distance L (shown in FIG. 2) along one longitudinal edge of the lower wall 22. As shown in FIG. 2, the outlet nozzle 34 is located generally transversely to the direction of travel of the substrate 12.

A wall member 36 is generally parallel with the sidewalls 16 and 18 and extends longitudinally within the chamber 28. The upper edge of the wall member 36 is attached to the lower surface of the upper wall 20, while the side edges of the wall member 36 are connected to the inner surfaces of the end walls 24 and 26. The wall member 36 cooperates with the sidewall 16 to define a downwardly extending inlet passageway 38. While the inlet passageway 38 is shown in the drawings as having a generally uniform cross-section, it will be appreciated that the wall member 36 can be positioned relative to the sidewall 16 in such a manner that the passageway 38 can be either converging or diverging. Typically, the spacing between the lower edge of the wall member 36 and the upper surface of the lower wall 22 (distance A in FIG. 1) is less than the spacing between the sidewall 16 and the wall member 36 (distance B) to define a converging passageway 40. Thus, the fluid, as it exits the inlet passageway 38, converges and accelerates as it enters the passageway 40.

A wall member 42 extends longitudinally within the chamber 28 and has its lower edge connected to the upper surface of the lower wall 22 and its side edges connected to the inner surfaces of the end walls 24 and 26. The wall member 42 is positioned within the chamber 28 such that it forms an angle S relative to a reference line generally perpendicular to the lower wall 22. The lower portion of the wall member 42 is spaced from the wall member 36 by a distance C, which is typically equal to the distance A, while the upper portion of the wall member 42 is spaced from the wall member 36 by a distance D, which is greater than the distance C. The wall member 42 cooperates with the wall member 36 to define an upwardly extending diverging passageway 44 with a generally increasing cross-sectional area. Thus, once the fluid has converged and accelerated in the passageway 40, the fluid will be caused to diverge and thus decelerate in the passageway 44. The upper end of the wall member 42 is spaced from the lower surface of the upper wall 20 by the distance A to define a converging passageway 46 which causes the fluid to accelerate as it enters the passageway 46.

A wall member 48 extends longitudinally within the chamber 28 and has its upper edge connected to the lower surface of the top wall 20 and its side edges connected to the inner surfaces of the end walls 24 and 26. The wall member 48 is positioned within the chamber 28 such that it forms an angle T relative to a reference line generally perpendicular to the upper wall 20. Typically, the upper wall 20 is substantially parallel to the lower wall 22. The upper portion of the wall member 48 is spaced from the upper edge of the wall member 42 by the distance C, while the lower portion of the wall member 48 is spaced from the lower portion of the wall member 42 by a distance E. The lower edge of the wall member 48 is spaced from the upper surface of the lower wall 22 by the distance A. The wall member 48 cooperates with the wall member 42 to define a downwardly extending diverging passageway 50, and cooperates with the lower wall 22 to define a converging passageway 52. It has been found that selecting angles S and T such that the ratio between the dimensions C and E is approximately one to four produces a diverging passageway with the desired deceleration effects. In the embodiment of FIG. 1, the angles S and T are each approximately 5°.

A pair of wall members 54 and 56 are mounted within the chamber 28 in a manner similar to the wall member 42, while a wall member 58 is mounted in a manner similar to the wall member 48. The wall members 48, 54, 56, and 58 cooperate to form additional diverging passageways 60, 62, 64, and 66, and additional converging passageways 68, 70, and 72, all of which cooperate to alternately decelerate and accelerate the fluid stream.

A pair of spaced-apart wall members 76 and 78 are positioned in generally parallel relationship with the sidewall 18 to define an upwardly extending outlet passageway 80 having a relatively constant cross-section and a downwardly extending outlet passageway 82 having a relatively constant cross section similar in area to the cross-sectional area of the passageway 80. The lower end of the passageway 82 terminates at the outlet nozzle 34. Typically, the wall members 76 and 78 are spaced apart by the distance W, which represents the spacing between the wall member 78 and the sidewall 18. As the fluid exits the diverging passageway 64 (formed by wall members 56 and 76), the fluid converges in an area 83 and enters the outlet passageway 80. The constant cross sections of the passageways 80 and 82 function to stabilize the velocity of the fluid stream such that, when the fluid exits the outlet nozzle 34, the velocity of the fluid will be at a relatively constant level the entire length of the nozzle 34. Typically, the width W of the outlet nozzle 34 is substantially equal to the distances A and C.

In some instances, when the overall length L (shown in FIG. 2) of the apparatus is relatively large, it may be desirable to provide a plurality of spaced-apart support rods 84 which extend through suitable apertures formed in the wall members to maintain the predetermined spacing between the wall members.

Also, in order to control the reaction time of the reactant substituents being applied to the substrate, an elongate vacuum device 86 may be disposed adjacent one side of the apparatus. The vacuum device 86 has an outlet 87 suitably coupled to a vacuum source 88. An elongate inlet slot 90 is provided in the vacuum device 86 to enable the controlled withdrawal of the substituents from the zone between the outlet nozzle 34 and the device 86 to enable more complete control over the process. As shown in FIG. 1, the vacuum device 86 can be constructed in a manner similar to the apparatus 10. It has been found that such a construction produces a uniform vacuum pull across the entire length of inlet slot 90.

It should be noted that the present invention, in its broadest sense, encompasses an apparatus which directs a flow of a fluid through a series of individual passageways which are adapted to cause a series of velocity changes in the fluid as the fluid flows through the passageways. It has been discovered that causing the fluid to flow in such a manner evenly distributes the fluid to an elongate outlet nozzle and enables a uniform laminar flow of constant velocity fluid to be applied to the surface of a substrate. It is believed that treating the flow of fluid in a manner as described above causes the molecules of the fluid to be evenly distributed throughout the length of the elongated outlet nozzle and causes the molecules to travel from the outlet nozzle in a generally parallel path to one another and at a constant velocity. Consequently, a laminar flow of constant velocity fluid is produced.

Generally, the velocity at which the fluid is delivered from the elongate nozzle is a function of the pressure at which the fluid is delivered into the inlet, and the overall dimensions at which the apparatus is constructed. The velocity at which the fluid is delivered from the outlet can be regulated by controlling the pressure at which the fluid is introduced into the apparatus or, alternatively, controlling the dimensions of the apparatus.

While the embodiment shown in FIG. 1 includes a series of alternating converging and diverging passageways which causes the fluid to alternately accelerate and decelerate as it flows through the series of passageways, it will be appreciated that the apparatus can be constructed in a different manner to achieve the desired velocity changes in the fluid as it travels through the passageways. For example, in FIG. 3, there is shown an alternate embodiment of an apparatus 100 which utilizes a parallel, spaced apart relationship between the internal wall members to achieve the desired velocity changes in the fluid.

Figure 3:
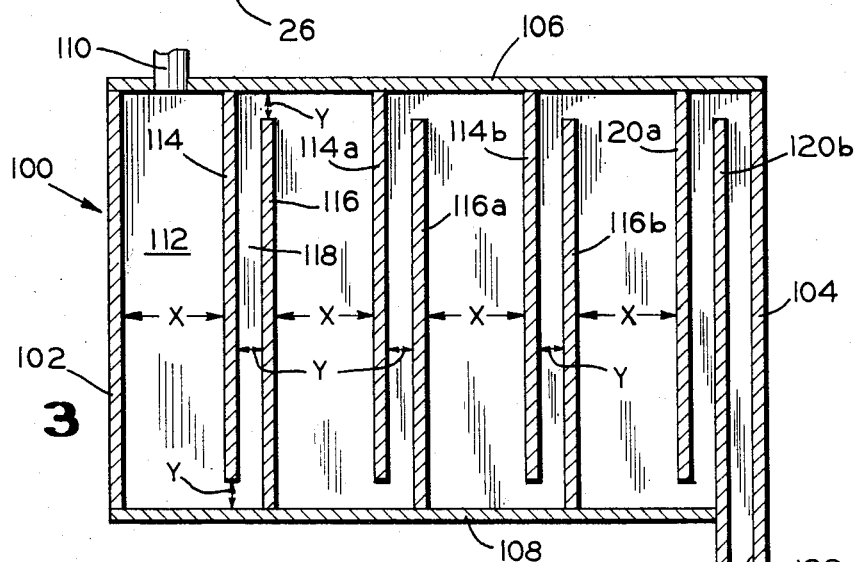
FIG. 3 is a cross-sectional schematic view of an alternate embodiment of the apparatus of the present invention.

In FIG. 3, the apparatus 100 is similar in external shape to the apparatus 10 of FIG. 1, and includes spaced apart generally parallel sidewalls 102 and 104, an upper wall 106 and a lower wall 108. The apparatus 100 includes an inlet 110 for introducing fluid into a downwardly extending inlet passageway 112 defined by a wall member 114 and the sidewall 102. The wall member 114 is generally parallel to the sidewall 102 and is spaced a distance X from the sidewall 102. The lower edge of the wall member 114 is spaced a distance Y from the upper surface of the lower wall 108.

A wall member 116 extends upwardly from the bottom wall 108 and is generally parallel to the wall member 114 for defining an upwardly extending passageway 118. The wall member 116 is spaced a distance Y from the wall member 114 and has an upper edge which is spaced a distance Y from the lower surface of the top wall 106. Thus, the fluid as it exits the inlet passageway 112, must converge and increase in velocity as it enters the passageway 118. It has been found that a ratio of four to one between the distances X and Y provide the desired velocity changes in the fluid.

A pair of wall members 114a and 114b extend downwardly from the top wall 106, while a pair of wall members 116a and 116b extend upwardly from the lower wall 108. Together, these wall members cooperate to form downwardly extending low velocity passageways and upwardly extending high velocity passageways similar to the passageways 112 and 118. A pair of wall members 120a and 120b are positioned in a manner similar to the wall members 76 and 78 of the apparatus 10 in FIG. 1 to form an outlet passageway of width W1 which distributes the fluid from an outlet 122. Typically, the width W1 is substantially equal to the distance Y.

Figure 4:
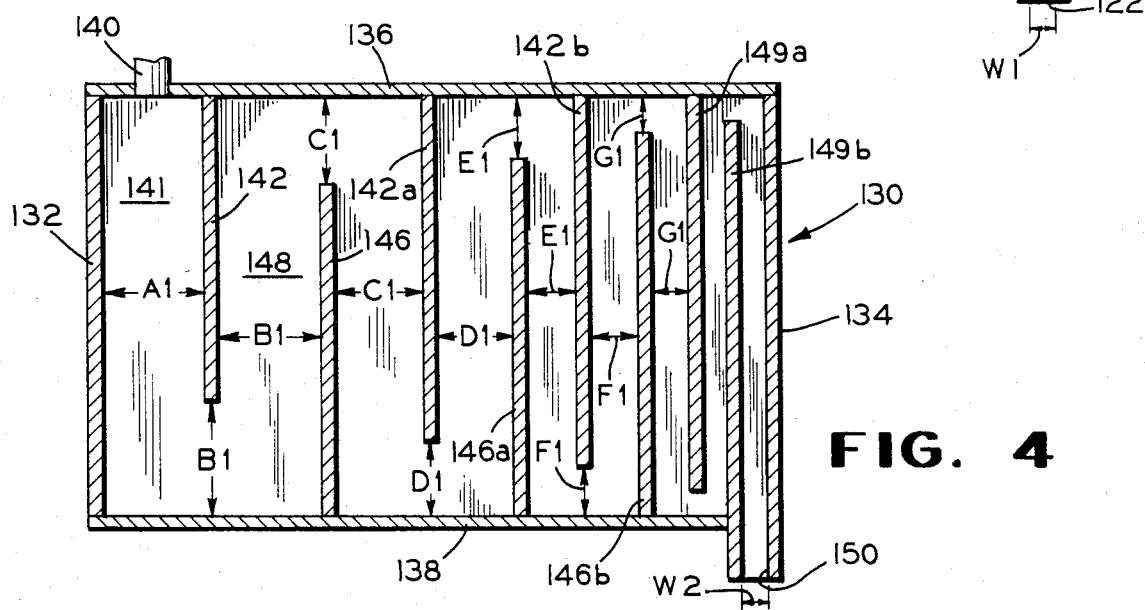
FIG. 4 is a cross-sectional schematic view of a further alternate embodiment of the apparatus of the present invention.

Referring to FIG. 4, there is shown a further alternate embodiment of an apparatus 130 which can be used to provide the desired changes in velocity of the fluid as it passes through a series of internal passageways. The apparatus 130 includes spaced apart parallel sidewalls 132 and 134, a top wall 136, and a lower wall 138. An inlet 140 is adapted to introduce a supply of fluid into a downwardly extending passageway 141 formed by a wall member 142 and the sidewall 132. The wall member 142 is generally parallel to the sidewall 132 and is spaced a distance A1 from the sidewall. The lower edge of the wall member 142 is spaced a distance B1 from the upper surface of the lower wall 138. A wall member 146 is attached to the lower wall 138 and is spaced a distance B1 from the wall member 142 to define an upwardly extending passageway 148. The upper edge of the wall member 146 is spaced a distance C1 from the lower surface of the top wall 136.

A pair of wall members 142a and 142b extend downwardly from the top wall 136 and cooperate with wall members 146a and 146b which extend upwardly from the bottom wall 138 to define a series of upwardly extending and downwardly extending passageways which are spaced apart in such a manner to define individual passageways which decrease in cross sectional area as the passageways move from the inlet to the outlet. Thus, in FIG. 4, the dimensions A1 through G1 represent decreasing distances. Such a construction causes the velocity of the fluid to continually increase as the fluid flows from one passageway to another. It has been found that satisfactory results are obtained by reducing the dimensions A1 through G1 such that the ratio between the distances A1 and G1 is approximately four to one. The apparatus 130 includes wall members 149a and 149b which form an outlet passageway of width W2 similar to the outlet passageway of the apparatus of FIG. 1 for distributing the fluid from an outlet nozzle 150.

Figure 5:
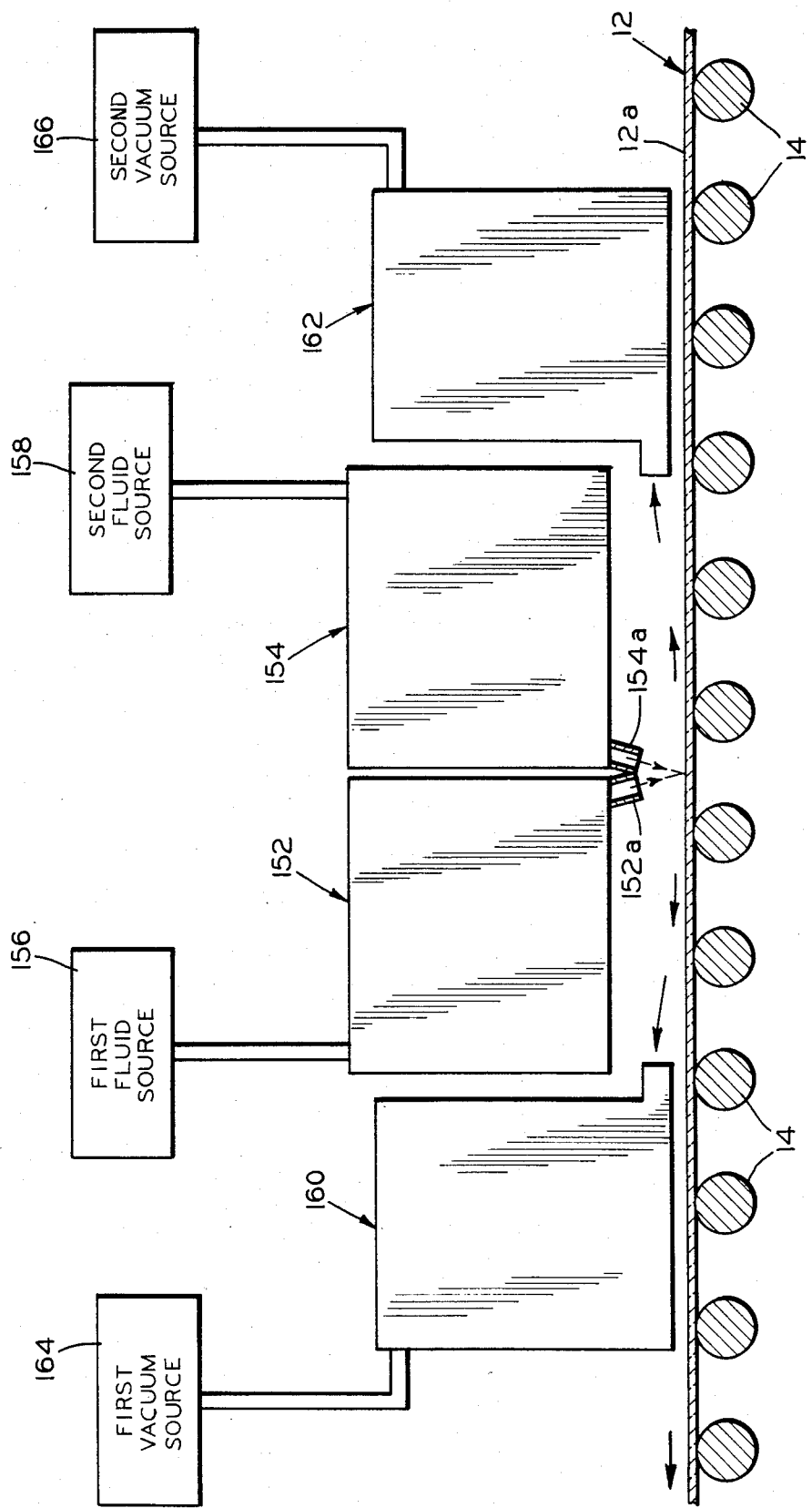
FIG. 5 is an alternate embodiment of the present invention wherein two of the apparatuses shown in FIG. 1 are positioned adjacent one another for directing two individual gaseous reactants toward the surface of a substrate.

In instances wherein more than one fluid or gaseous reactant is desired to be supplied to the surface of the substrate, the arrangement shown in FIG. 5 can be utilized. In this case, two apparatus 152 and 154, similar to the apparatus 10, are connected to receive a supply of fluid from first and second fluid sources 156 and 158, respectively. The apparatus 152 and 154 are positioned with their respective outlet nozzles 152a and 154a in adjacent relationship to one another. The outlet nozzles 152a and 154a can be formed to direct the individual gaseous reactants in a path which intersect at the surface 12a of the substrate. Also, a pair of vacuum devices 160 and 162, similar in construction to the vacuum device 86 of FIG. 1, are coupled to first and second vacuum sources 164 and 166 respectively, and can be positioned to control the withdrawal of the fluids from the surface of the substrate 12.

In accordance with the provisions of the patent statutes, the principles and mode of operation of the present invention have been illustrated and described in what is considered to represent its preferred embodiments. It should, however, be understood that the invention may be practiced otherwise than as specifically illustrated and described without departing from its spirit or scope.

What is claimed is:

1. An apparatus for directing a laminar flow of constant velocity fluid toward a surface of a substrate comprising:
    inlet means adapted to communicate with a source of fluid;
    outlet means spaced from said inlet means and having an outlet nozzle adapted to be positioned adjacent the surface of the substrate, said outlet nozzle defining an elongate opening extending a predetermined distance along the substrate; and
    a plurality of serially arranged individual passageways interconnecting said inlet means and said outlet means, each of said individual pasageways including a portion having a cross-sectional area different from the cross-sectional area of a portion of each of the adjacent ones of said passageways causing the velocity of the fluid to vary as the fluid flows through said passageways and causing the fluid to be delivered from said outlet nozzle of said outlet means in a uniform laminar flow of relatively constant velocity across the entire length of said elongate opening.

2. The apparatus defined in claim 1 wherein said serially arranged individual passageways include a first predetermined number of individual converging passageways and a second predetermined number of individual diverging passageways, a separate one of said diverging passageways connected between adjacent ones of said converging passageways whereby the fluid is caused to accelerate in said converging passageways and to decelerate in said diverging passageways.

3. The apparatus defined in claim 2 wherein the ratio between the portion of said diverging passageways having the largest cross-sectional area to the portion of said converging passageways having the smallest cross-sectional area is approximately four to one.

4. The apparatus defined in claim 2 including at least five converging passageways and at least five diverging passageways.

5. The apparatus defined in claim 1 wherein said individual passageways include a first group of passageways each having a portion of relatively uniform first predetermined cross-sectional area and a second group of passageways each having a portion of relatively uniform second predetermined cross-sectional area different from the first predetermined area of said first group, a separate one of said first group of passageways connected between adjacent ones of said second group of passageways whereby the velocity of the fluid in said first group of passageways is different from the velocity of the fluid in said second group of passageways.

6. The apparatus defined in claim 5 wherein the ratio between said second predetermined area and said first predetermined area is approximately four to one.

7. The apparatus defined in claim 1 wherein each of said serially arranged individual passageways includes a portion of relatively uniform cross-sectional area, the cross-sectional areas of each of said passageways progressively decreasing from said inlet means to said outlet means, whereby the velocity of the fluid is progressively increased as the fluid travels from said inlet means to said outlet means.

8. The apparatus defined in claim 1 including an outer housing defining a chamber containing said individual passageways, said inlet means located proximate one end of said housing and said outlet means located proximate the opposite end of said housing.

9. The apparatus defined in claim 8 including a plurality of spaced apart wall members mounted within said housing defining said passageways.

10. The apparatus defined in claim 9 wherein adjacent ones of said wall members are non-parallel to one another.

11. The apparatus defined in claim 1 wherein said outlet means includes an outlet passageway of a predetermined length, said outlet passageway having a substantially uniform cross-section throughout the length of said outlet passageway causing the velocity of the fluid to stabilize at a constant level before the fluid is delivered from the opening of said outlet.

12. A method of producing a uniform laminar flow of a fluid along the surface of a substrate traveling in a linear path comprising the steps of:
    (a) directing a fluid stream through a series of individual passageways causing the velocity of the fluid stream to vary as the fluid passes through the passageways to produce a uniform laminar flow of fluid; and
    (b) directing the uniform laminar flow of fluid at a relatively constant velocity onto the surface of the substrate through the entire length of an elongate outlet slot positioned adjacent the surface of the substrate and extending along at least a portion of the substrate.

13. The method according to claim 12 including the step of stabilizing the fluid flow prior to being directed onto the surface.

14. The method according to claim 12 wherein step (a) includes causing the fluid stream to be alternately accelerated and decelerated.

15. The method according to claim 12 wherein step (a) includes causing the velocity of the fluid stream to be alternately increased to a first predetermined constant velocity and decreased to a second predetermined constant velocity as the fluid stream flows through the passageways.

16. The method according to claim 12 wherein step (a) includes causing the velocity of the fluid stream to be progressively increased as the fluid stream flows through the passageways.

17. The method according to claim 12 wherein step (a) includes causing the velocity of the fluid stream to stabilize at a constant level, thereby producing a uniform laminar flow of constant velocity fluid.

18. An apparatus for withdrawing a fluid stream from a surface of a substrate comprising:
    outlet means adapted to be connected to a source of vacuum;
    inlet means having an inlet slot adapted to be positioned adjacent the surface of the substrate to receive the fluid stram, said inlet slot defining an elongate opening extending a predetermined distance along the substrate; and
    a plurality of serially arranged individual passageways interconnecting said inlet means and said outlet means, each of said individual passageways including a portion having a cross-sectional area different from the cross-sectional area of a portion of each of the adjacent ones of said passageways for causing the velocity of the fluid to vary as the fluid flow through said passageways and causing the fluid to be withdrawn from the surface in a uniform manner through out the entire length of said elongate opening.

19. The apparatus defined in claim 18 including an outer housing defining a chamber containing said individual passageways, said inlet means located proximate one end of said housing and said outlet means located proximate the opposite end of said housing.

20. The apparatus defined in claim 19 including a plurality of spaced apart wall members mounted within said housing defining said passageways.

21. An apparatus for directing a laminar flow of constant velocity fluid toward a surface of a sheet of glass traveling in a linear path, said apparatus comprising:

inlet means adapted to communicate with a source of fluid;

an outlet means spaced from said inlet means and having an outlet nozzle adapted to be positioned adjacent the surface of the glass, said outlet nozzle defining an elongate opening extending a predetermined distance across the glass generally tranversely relative to the linear path of the glass; and a plurality of serially arranged individual passageways interconnecting said inlet means and said outlet means, each of said individual passageways including a portion having a cross-sectional area different from the cross-sectional area of a portion of each of the adjacent ones of said passageways causing the velocity of the fluid to vary as the fluid flows through said passageways and causing the fluid to be delivered from said outlet nozzle in a laminar flow of relatively constant velocity across the entire length of said elongate opening.

22. The apparatus defined in claim 21 including vacuum means for withdrawing the flow of fluid from the surface of the glass.

23. The apparatus defined in claim 22 wherein said vacuum means includes outlet means adapted to be connected to a source of vacuum, inlet means adapted to be positioned adjacent the surface of the substrate to receive the flow of fluid, said inlet means including an opening extending generally transversely relative to the linear path of the glass, and a plurality of serially arranged individual passageways interconnecting said inlet means and said outlet means, each of said individual passageways including a portion having a cross-sectional area different from the cross-sectional area of a portion of each of the adjacent ones of said passageways for causing the velocity of the fluid to vary as the fluid flows through said passageways, whereby the fluid is withdrawn from the surface of the glass in a uniform manner.

24. An apparatus for directing a laminar flow of constant velocity fluid toward a surface of a substrate comprising:

inlet means adapted to communicate with a source of fluid; and outlet means spaced from said inlet means having an outlet nozzle adapted to be positioned adjacent the surface of the substrate, said outlet nozzle defining an elongate opening extending a predetermined distance along the substrate; and a plurality of serially arranged individual passageways interconnecting said inlet means and said outlet means, each of said passageways having an elongate portion extending substantially parallel to and substantially the same distance as said elongate opening causing the fluid to be delivered from said outlet nozzle of said outlet means in a uniform laminar flow of relatively constant velocity across the entire length of said elongate opening.

25. A method of producing a uniform laminar flow of a fluid along the surface of a substrate traveling in a linear path comprising the steps of:

(a) directing a fluid stream through a series of individual passageways causing the velocity of the fluid stream to vary as the fluid passes through the passageways to produce a uniform laminar flow of fluid; and (b) directing the uniform laminar flow of fluid of relatively constant velocity onto the surface of the substrate through the entire length of an elongate outlet slot positioned adjacent the surface of the substrate and extending along at least a portion of the substrate transversely relative to the linear path of the substrate.

26. The apparatus as defined in claim 22 wherein said vacuum means is a first vacuum means positioned on one side of said outlet means and including a second vacuum means positioned on the opposite side of said outlet means for assisting said first vacuum means in the withdrawal of the flow of fluid from the surface of the glass.

27. The apparatus as defined in claim 23 wherein said vacuum means is a first vacuum means and said inlet means of said first vacuum means is positioned on one side of said outlet means for delivering the flow of fluid, said apparatus including a second vacuum means having an outlet means adapted to be connected to a source of vacuum, inlet means adapted to be positioned adjacent the surface of the substrate on the opposite side of said outlet means for delivering the flow of fluid to receive the flow of fluid, said inlet means including an opening extending generally transversely relative to the linear path of the glass, and a plurality of serially arranged individual passageways interconnecting said inlet means and said outlet means, each of said individual passageways including a portion having a cross-sectional area different from the cross-sectional area of a portion of each of the adjacent ones of said passageways for causing the velocity of the fluid to vary as the fluid flows through said passageways, whereby the fluid is withdrawn from the surface of the glass in a uniform manner.

* * * * *